(12) United States Patent
Lee et al.

(10) Patent No.: US 7,763,397 B2
(45) Date of Patent: Jul. 27, 2010

(54) PHOTOMASK REGISTRATION ERRORS OF WHICH HAVE BEEN CORRECTED AND METHOD OF CORRECTING REGISTRATION ERRORS OF PHOTOMASK

(75) Inventors: Myoung-Soo Lee, Suwon-si (KR); Suk-Jong Bae, Seoul (KR); Jung-Hoon Lee, Yongin-si (KR); Seong-Woo Choi, Suwon-si (KR); Byung-Gook Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 894 days.

(21) Appl. No.: 11/591,152

(22) Filed: Nov. 1, 2006

(65) Prior Publication Data

US 2008/0032206 A1    Feb. 7, 2008

(30) Foreign Application Priority Data

Aug. 7, 2006  (KR) .................. 10-2006-0074356

(51) Int. Cl.
*G03F 1/00*   (2006.01)
(52) U.S. Cl. ............................. 430/5; 430/22; 430/311
(58) Field of Classification Search .................. 430/5, 430/311, 395; 355/35
See application file for complete search history.

(56) References Cited

U.S. PATENT DOCUMENTS 6,556,279 B1 * 4/2003 Meisburger et al. ........... 355/69
2004/0110073 A1 * 6/2004 Kaneko et al. ................. 430/5
2005/0084767 A1 * 4/2005 Zait et al. ...................... 430/5
2005/0280789 A1 * 12/2005 Bruls et al. ................... 355/53
2006/0251971 A1 * 11/2006 Schenker ...................... 430/5

FOREIGN PATENT DOCUMENTS

| JP | 63006842 | 1/1988 |
| JP | 04-196211 | 7/1992 |
| KR | 1020010030280 | 4/2001 |
| KR | 20020022117 | 3/2002 |
| KR | 20050121390 | 12/2005 |

OTHER PUBLICATIONS

English Abstract of Publication No. 63-006842, Jan. 1988.
English Abstract of Publication No. 1020020022117, Mar. 2002.
English Abstract of Publication No. 10-2005-0121390, Dec. 2005.
English Abstract Publication No. 04-196211, Jul. 1992.
English Abstract Publication No. 10020010030280, Apr. 2001.

* cited by examiner

*Primary Examiner*—Mark F Huff
*Assistant Examiner*—Rashid Alam
(74) *Attorney, Agent, or Firm*—F. Chau & Associates, LLC

(57) ABSTRACT

Provided are photomask registration errors of which have been corrected and a method of correcting the registration errors of a photomask. The photomask includes a photomask substrate, an optical pattern formed on one surface of the photomask substrate, and a plurality of stress generation portions formed in the photomask substrate. A method of correcting the registration errors of a photomask includes the steps of forming an optical pattern on a photomask substrate, measuring the registration errors of the optical pattern, and forming a plurality of stress generation portions in the photomask substrate so that the stress generation portions correspond to the measured registration errors.

34 Claims, 6 Drawing Sheets

PHOTOMASK REGISTRATION ERRORS OF WHICH HAVE BEEN CORRECTED AND METHOD OF CORRECTING REGISTRATION ERRORS OF PHOTOMASK

CROSS-REFERENCE TO RELATED APPLICATION

This application claims priority from Korean Patent Application No. 10-2006-0074356 filed on Aug. 7, 2006, the disclosure of which is hereby incorporated by reference herein in its entirety.

BACKGROUND OF THE INVENTION

1. Technical Field

The present disclosure relates to photomask registration errors of which have been corrected, and to a method of correcting the registration errors of a photomask and, more particularly, to photomask registration errors of which have been corrected by locally forming stress generation portions in a photomask substrate, and to a method of correcting the registration errors of a photomask.

2. Description of the Related Art

When fabricating highly integrated semiconductor devices, the development of a photolithography process for forming a basic pattern shape is significant. The reason for this is because the pattern of a semiconductor device is formed first from a photoresist pattern which is formed in the photolithography process. Furthermore, a highly significant factor in the photolithography process is the accuracy of the optical pattern formed on a photomask that is used in the photolithography process because a pattern for fabricating semiconductor devices is formed on a wafer by transferring the optical pattern, which is formed on a photomask, onto the wafer using a laser beam.

The accuracy of the optical pattern formed on the photomask may be defined and measured using various factors. For example, the factors may include the accuracy of an optical pattern, the distance between optical patterns, or the direction of an optical pattern. Ideally, the distance between optical patterns should be uniform throughout all of the optical patterns of a photomask. However, a photomask is typically formed by drawing optical patterns one by one using electron beam lithography equipment, rather than by forming all of the optical patterns at one time.

For example, in a transmission type photomask, a light-blocking layer for blocking light is formed on a photomask substrate. A photoresist layer is formed on the light-blocking layer. An electron gun mounted on the electron beam lithography equipment locally radiates an electron beam onto the photoresist layer, thereby patterning the photoresist layer. The light-blocking layer is etched using the patterned photoresist layer as an etching mask, thereby forming an optical pattern on the photomask.

Meanwhile, a reflection type photomask using Extreme Ultraviolet (EUV) light is fabricated in such a way that a reflection layer is formed on a photomask, and then an absorbent pattern, which does not reflect light, is formed on the reflection layer. In a manner similar to that used in the fabrication of the transmission type photomask, a method of forming an absorbent is performed by fastening a reflection type photomask substrate to a stage, forming a photoresist layer on an absorbent layer, irradiating an electron beam so as to pattern the photoresist layer, and etching the absorbent layer using the patterned photoresist as an etching mask, thereby forming an optical pattern.

The photomask substrate, onto which the electron beam is irradiated, is put on the movable stage. While the stage moves in forward, rearward, rightward and leftward directions, the electron beam is irradiated onto the photomask substrate. Accordingly, positional error may be introduced during the movement of the stage. Such a positional error may in turn result in the optical pattern not being ideally formed on the photomask substrate.

For example, positional errors occurring during the movement of a stage may locally distort optical pattern shapes on photomask substrates, may prevent optical patterns on photomask substrates from maintaining accurate and identical distances, and may cause optical patterns to be directed in erroneous directions.

Typically, such errors are represented by registration and orthogonality. Registration is a measure of the uniformity of distance or pitch between optical patterns. Orthogonality is a measure of the accuracy of the direction in which each optical pattern is formed. In more detail, the term "registration" indicates whether the positions at which an optical pattern is formed have an accurate distance therebetween. The term "orthogonality" indicates whether the direction in which optical patterns are repeatedly formed has the correct angle (for example, 0° or 90°).

In the present specification, both types of errors will be collectively referred to as "registration errors" for simplicity of description.

FIGS. 1A and 1B are registration maps 100a and 100b that respectively illustrate the case where an optical pattern 115a has ideal registration on a conventional photomask and the case where an optical pattern 115b has a registration error on a conventional photomask.

FIG. 1A is the registration map 100a of the conventional photomask having the ideal optical pattern 115a.

Referring to FIG. 1A, the registration map 100a, in which an optical pattern 115a having a registration error of 0 (zero) is formed on the photomask, is illustrated. The registration map 100a has the same shape as the registration map of computer data for forming the optical pattern 115a on the photomask. However, an ideal photomask having a registration error of 0, shown in FIG. 1A, may not be formed.

FIG. 1B is the registration map 100b, in which the optical pattern 115b has positive (+) and negative (−) registration errors. The registration map 100b is an example of the registration map of an actual photomask.

FIG. 1B is the registration map 100b in which the optical pattern 115b is not ideally formed on the photomask, but has positive (+) or negative (−) registration errors in the X or Y direction. Regions a and c are regions in which the optical pattern 115b is formed with registration errors in a positive (+) direction, and regions b and d are regions in which the optical pattern 115b is formed with registration errors in the negative (−) direction.

The sides of each lattice are the registration values of the optical pattern 115b formed based on lithography data. Assuming that one lattice is one step of lithography, respective steps have non-uniform registration errors. Consequently, the optical pattern 115b is not uniformly formed, but is non-uniformly formed, as shown in FIG. 1.

In the case where registration errors occur in the positive (+) or negative (−) direction to an extent that exceeds a tolerance, as shown in FIG. 1B, an accurate optical pattern may not be formed. If each optical pattern is not correctly formed, a difficulty may occur in the same photomask layer and a more serious overlap difficulty may occur between photomask layers. That is, registration error in one photomask layer may be doubled if the photomask layer overlaps another photomask layer. If such registration errors are accumulated, not only may it be difficult to form normal optical patterns, but the resistance may also increase, or the reliability of completed devices may be adversely affected, even though they are formed.

Such registration errors vary according to the lithography equipment, and also vary according to the process conditions of a lithography process. In addition, even when only a single photomask is fabricated, registration errors may vary across the entire photomask, or may vary locally.

A method of overcoming the above-mentioned registration errors under the current conventional processes typically include only a method of reducing registration errors by finding a registration trend in the same equipment to reduce factors and maintain stable process conditions. To reduce the registration errors, the improvement of photomask manufacturing equipment is fundamentally required. However, the improvement of the photomask manufacturing equipment is not an issue that can be easily overcome within a short period of time because photomasks are typically manufactured using the best method.

In addition, registration errors may occur for other reasons. Although a lithography process is performed based on an accurate registration value in lithography equipment, registration may still be erroneous if a photomask substrate itself is defective. For example, if a photomask substrate has an uneven surface and a curve or inclination greater than a tolerance, a completed photomask may still have registration errors locally or throughout the substrate thereof, even though the lithography process is performed based on an accurate registration value.

Typically, photomasks having registration errors exceeding a positive (+) or negative (−) tolerance, or which show severe fluctuations, are not used, but rather are discarded. If photomasks have uniform registration errors throughout the substrates thereof, they can be used after the correction of the errors using software. However, photomasks that have registration errors beyond a tolerance range and which cannot be corrected due to severe fluctuations may not be used in an exposure process.

Accordingly, if the erroneous registration of completed photomasks can be corrected, significant results can be expected in the yield, productivity, reliability, performance, of photomasks and semiconductor devices.

SUMMARY OF THE INVENTION

In accordance with an exemplary embodiment of the present invention, a photomask is provided. The photomask includes a photomask substrate, an optical pattern formed on one surface of the photomask substrate and a plurality of stress generation portions formed in the photomask substrate.

The plurality of stress generation portions may be formed to correspond to the registration errors of the optical pattern. In the photomask, the registration errors of the optical pattern are corrected as the optical pattern physically moves due to the action of the stress generation portions.

The stress generation portions may generate stress that contracts the photomask substrate because the density of the stress generation portions is higher than the average density of the photomask substrate. Alternatively, the stress generation portions may generate stress that expands the photomask substrate because the density of the stress generation portions is lower than the average density of the photomask substrate.

The stress generation portions may have an elliptical sphere in which the size in a vertical direction is larger than that in a horizontal direction.

The stress generation portions may be formed at positions corresponding to a range of about ¼ to about ¾ of the thickness of the photomask substrate, more particularly at positions corresponding to about ½ of the thickness of the photomask substrate.

The stress generation portions may be formed in the same horizontal plane, or in a number of horizontal planes, that is, in a plurality of layers.

The stress generation portions may be formed above or below the center horizontal plane of the photomask substrate. That is, the stress generation portions may be formed at positions close to either a surface in which the optical pattern is formed or the opposite surface thereof.

The stress generation portions may be formed by irradiating a laser beam in pulse form.

The photomask may be a reflection type photomask using, for example, EUV light.

The reflection type photomask includes a reflection pattern that is formed on one side of the photomask substrate. The reflection pattern is a pattern that reflects irradiated light based on a pattern shape.

The reflection pattern may be formed of a plurality of material layers. In particular, the reflection pattern may be formed by alternately stacking a silicon layer and a molybdenum layer. In addition, an oxide layer may be formed as a top layer.

The substrate of the reflection type photomask may be made of quartz. A metal layer, such as a chrome, aluminum or molybdenum layer, may be further formed on the side of the substrate opposite the side on which the reflection pattern is formed.

In accordance with an exemplary embodiment of the present invention, a method of correcting the registration errors of a photomask is provided. The method includes forming an optical pattern on a photomask substrate, measuring the registration errors of the optical pattern, and forming a plurality of stress generation portions in the photomask substrate so that the stress generation portions correspond to the measured registration errors.

BRIEF DESCRIPTION OF THE DRAWINGS

Exemplary embodiments of the present invention can be understood in more detail from the following detailed description taken in conjunction with the accompanying drawings, in which.

DESCRIPTION OF THE EXEMPLARY EMBODIMENTS

Figure 1A:
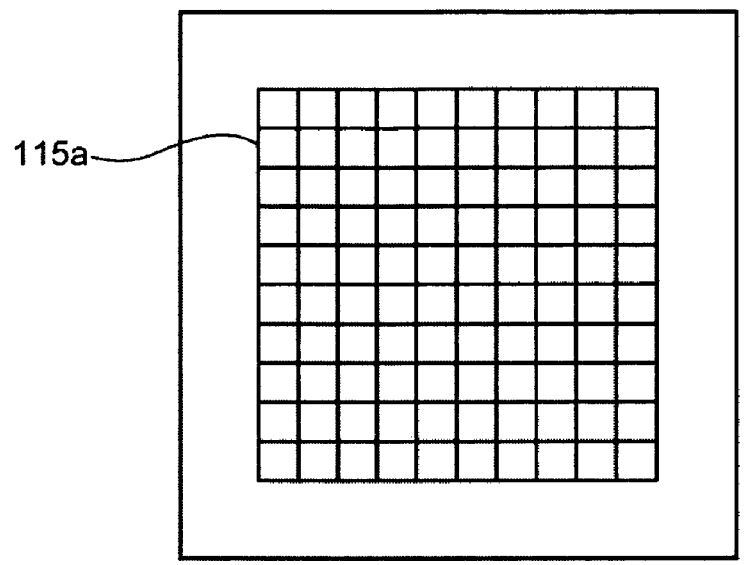
FIGS. 1A and 1B are registration maps respectively illustrating an example in which optical patterns have ideal registration on a photomask, and an example in which optical patterns have registration errors on a photomask.
Figure 1B:
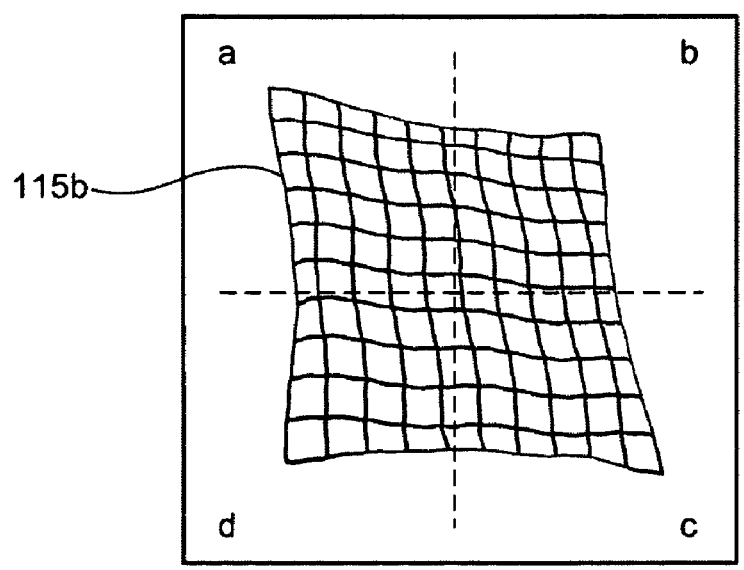

In the present specification, exemplary embodiments will be described with reference to plan and sectional views, that is, idealized schematic views of the present invention. The shapes shown in the illustrative drawings may be modified according to manufacturing technology and/or allowable error. The exemplary embodiments of the present invention are not limited to the illustrated specific shapes, but may include variations of shapes generated according to a manufacturing process. Furthermore, regions illustrated in the drawings have a schematic attribute, and the shapes of the regions illustrated in the drawings illustrate specific shapes of regions of devices, and do not limit the scope of the exemplary embodiments of the invention. In the present specification, to facilitate the understanding of the technical spirit of the present invention, terms related to the technical field to which the present invention pertains may be interchangeably used, and should be considered to have similar meanings within a range in which the technical spirit of the present invention is not misunderstood. For example, a photomask, a photomask substrate and a registration map may be mixedly used and understood. Furthermore, the term "optical pattern" may also be used and understood to mean the registration of an optical pattern. That is, the term "optical pattern" may be understood to have several meanings.

The term "optical pattern" may include all patterns, such as the reflection type pattern of a reflection type photomask, the light-blocking pattern of a transmission type photomask, and the phase shift pattern of a phase shift mask.

Furthermore, the term "photomask" may include a reflection type photomask using a EUV light, other transmission type photomasks, a phase shift photomask, and a reticle.

In the present specification, the reflection type photomask using an EUV light will be described as an example. However, it is to be understood that the scope of the exemplary embodiments of the present invention is not limited to the contents described in the present specification. In the transmission type photomask, there is only a difference in that an optical pattern is of a transmission type, but the transmission type photomask uses the same method of correcting registration as the reflection type photomask. Accordingly, those having ordinary skill in the art of the present invention may readily predict a method of correcting the registration of the transmission type photomask or phase shift photomask from the embodiments illustrated in the present specification.

A photomask, the registration errors of which have been corrected, and a method of correcting the registration errors of a photomask according to exemplary embodiments of the present invention will be described in detail with reference to the drawings.

Figure 2A:
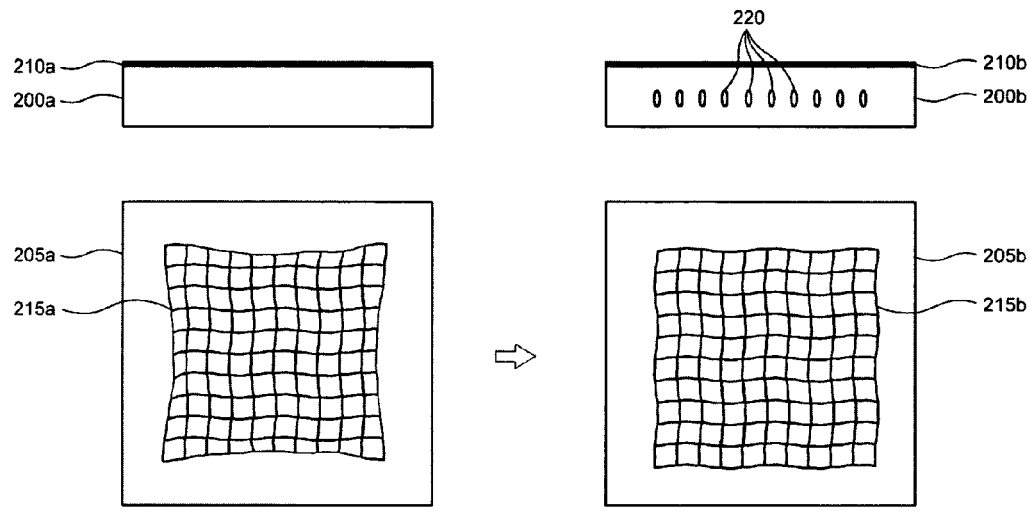
FIGS. 2A to 2C are cross sectionals and registration maps of photomasks, in which the registration errors of optical patterns have been corrected by forming various stress generation portions in a photomask substrate, according to an exemplary embodiment of the present invention.
Figure 2B:
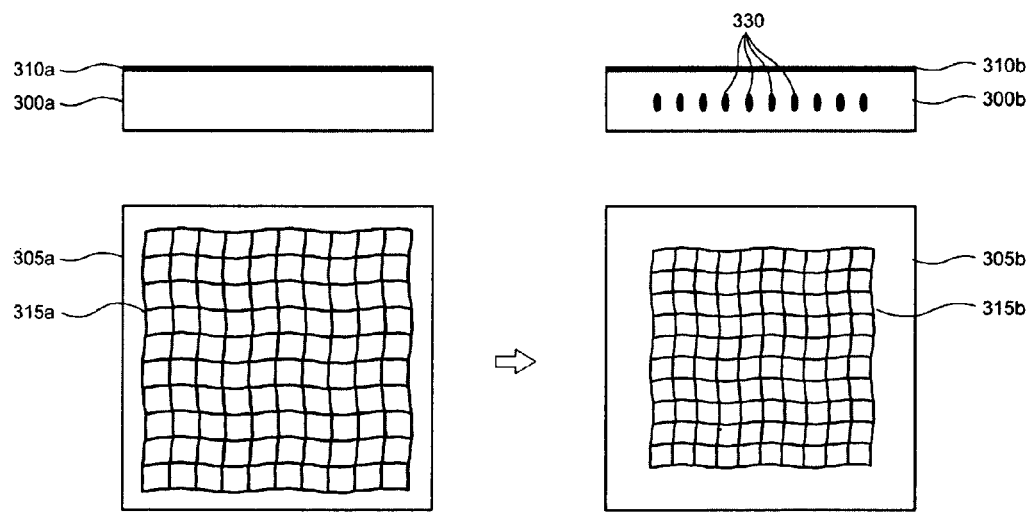
Figure 2C:
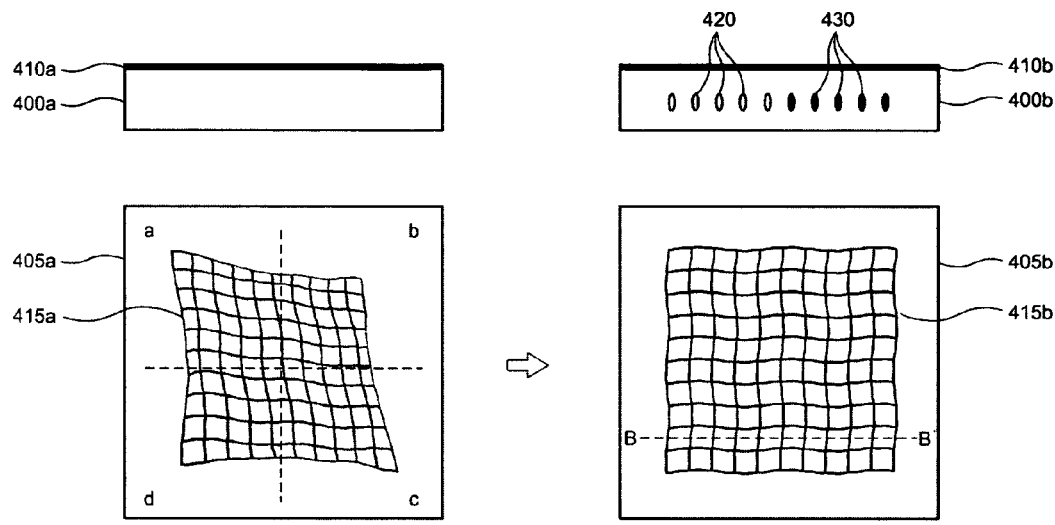

FIGS. 2A to 2C are cross sections and registration maps of photomasks, in which the registration errors of optical patterns are corrected by forming various stress generation portions in photomask substrates according to an exemplary embodiment of the present invention. Each of the drawings may be exaggerated to promote an understanding of the technical spirit of the present invention.

FIG. 2A is a cross section and registration map 205 of the substrate of a photomask 200 in which the registration errors of an optical pattern 210 are corrected in a positive (+) direction according to an exemplary embodiment of the present invention.

Referring to FIG. 2A, a photomask substrate 210b the registration errors of which have been corrected is achieved by forming expansion stress generation portions 220 in the substrate of a photomask 200a in which an optical pattern 210a has negative (−) registration errors and expanding the volume of the substrate of a photomask 200a.

In more detail, if the expansion stress generation portions 220 are formed in the regions of the substrate of the photomask 200b having no ideal registration, for example, regions having negative (−) registration errors, the substrate of the photomask 200a is expanded, and thus registration errors are corrected. As described above, reference numeral 205 may be understood to refer to a plan view or registration map of the photomask 200 and reference numeral 215 may be understood to refer to the optical pattern 210 or registration map of the optical pattern 210.

The expansion stress generation portions 220 are portions in which stress that lowers density and increases volume is generated. For example, if a laser beam is irradiated onto the inside of the substrate of the photomask 200a, the bonding state of the portion of the substrate of the photomask 200b, onto which the laser beam has been irradiated, may change depending on process conditions for the radiation of the laser beam.

For example, as the bonding state of the substrate of the photomask 200b changes, a portion having lowered density may be formed. The portion having density, which has been lowered as the bonding state changes, generates stress that expands the substrate of the photomask 200b. In this case, if portions having lowered density are locally formed, local expansion stress may be generated within the substrate of the photomask 200b, thus locally expanding the substrate of the photomask 200b. Furthermore, if a plurality of portions having lowered density is formed in the same direction, expansion stresses are added to each other. Thus, there is a benefit obtained in that the substrate of the photomask 200b may be expanded widely and completely in that direction. Accordingly, if the expansion stress generation portions 220 are formed in the region of the substrate of the photomask 200a that has registration errors, for example, a region having negative (−) errors, compared to a case where registration is ideal, as in the present exemplary embodiment, the substrate of the photomask 200b may be expanded locally or completely. Therefore, the optical pattern 210a formed on the substrate of the photomask 200b moves in the direction in which the substrate of the photomask 200b is expanded. As a result, the negative (−) registration errors of the optical pattern 210a may be corrected to be close to the ideal case (e.g., 0; zero).

To promote an understanding of the technical spirit according to the present exemplary embodiment, an example in which negative (−) registration errors are corrected has been shown in FIG. 2A. Although, in FIG. 2A, the expansion stress generation portions 220 are formed in the same plane throughout the substrate of the photomask 200b, it should be understood that the expansion stress generation portions 220 may be formed locally, or may be formed in a plurality of planes. It is therefore to be noted that the description given in conjunction with FIG. 2A includes not only an example in which the expansion stress generation portions 220 are formed throughout the substrate, as in FIG. 2A, but also an example in which the expansion stress generation portions 220 are locally formed. For example, in the case where registration errors are to be locally corrected, registration errors may be locally corrected by irradiating a laser beam onto only the region of the inside of the substrate of the photomask 200b, in which the registration errors are to be corrected, thereby locally forming the expansion stress generation portions 220. Furthermore, the expansion stress generation portions 220 may be formed in a plurality of layers to increase the registration correction effect. Although, as shown in FIG. 2A, the expansion stress generation portions 220 are formed in the same plane and in a single layer, it should be understood that various expansion stress generation portions 220 may be formed in a plurality of planes. Although, in FIG. 2A, expansion stress generation portions 220 having the same size, the same distance and the same pitch are illustrated, it should be understood that expansion stress generation portions 220 having various sizes and distances may be formed.

When the expansion stress generation portions 220 are formed with, for example, the number, size, distance, pitch, thereof adjusted in various manners, the volume of the substrate of the photomask 200b may be expanded in a desired direction and size. Therefore, even in the case where the registration errors of the optical pattern 210a having various sizes exist on the substrate of the photomask 200b, the registration errors may be corrected by forming the expansion stress generation portions 220 in various manners so that they are suitable for the respective sizes of the errors.

The expansion stress generation portions 220 may be formed to have various sizes, densities and shapes depending on methods of irradiating a laser beam. For example, the sizes, densities and shapes of the expansion stress generation portions 220 formed in the substrate of the photomask 200b may be adjusted depending on various process conditions, such as the wavelength, focus position, focus size, radiation time and radiation cycle of the irradiated laser beam. That is, various types of expansion stress maybe generated. Various registration errors maybe corrected by forming various expansion stress generation portions 220 as described above. A method of forming various expansion stress generation portions 220 will be described later.

FIG. 2B is a cross section and registration map 305 of the substrate of a photomask 300, in which the registration errors of an optical pattern 310 are corrected in a negative (−) direction according to another exemplary embodiment of the present invention.

Referring to FIG. 2B, a photomask substrate 310b, the registration errors of which have been corrected, is achieved by forming contraction stress generation portions 330 in the substrate of a photomask 300a in which an optical pattern 310a has positive (+) registration errors, and contracting the volume of the substrate of a photomask 300a.

In more detail, if the contraction stress generation portions 330 are formed in regions of the substrate of the photomask 300b having no ideal registration, for example, regions having positive (+) registration errors, the substrate of the photomask 300a is contracted and, thus, registration errors are corrected. As described above, reference numeral 305 may be understood to refer to a plan view or registration map of the photomask 300 and reference numeral 315 may be understood to refer to the optical pattern 310 or registration map of the optical pattern 310.

The contraction stress generation portions 330 are portions in which stress that lowers density and increases volume is generated. For example, if a laser beam is irradiated onto the inside of the substrate of the photomask 300a, the bonding state of the portion of the substrate of the photomask 300b, onto which the laser beam has been irradiated, may change depending on process conditions for the radiation of the laser beam.

For example, as the bonding state of the substrate of the photomask 300b changes, portions having increased density may be formed. The portion having density, which has been increased as the bonding state changes, generates stress that contracts the substrate of the photomask 300b. In this case, if portions having increased density are locally formed, local contraction stress may be generated within the substrate of the photomask 300b, thus locally contracting the substrate of the photomask 300b. Furthermore, if a plurality of portions having lowered density is formed in the same direction, contraction stresses are added to each other, and therefore a benefit is obtained in that the substrate of the photomask 300b is contracted widely and completely in the direction. Accordingly, if the contraction stress generation portions 330 are formed in a region of the substrate of the photomask 300a that has registration errors, for example, a region having negative (+) errors, compared to a case where registration is ideal, as in the present exemplary embodiment, the substrate of the photomask 300b may be contracted locally or completely. Therefore, the optical pattern 310a formed on the substrate of the photomask 300b moves in the direction in which the substrate of the photomask 300b is contracted. As a result, the positive (+) registration errors of the optical pattern 210a maybe corrected to be close to an ideal case (e.g., 0; zero).

To promote the understanding of the technical spirit according to the present embodiment, an example in which positive (+) registration errors are corrected has been shown in FIG. 2B. Although, in FIG. 2B, the contraction stress generation portions 330 are formed in the same plane throughout the substrate of the photomask 300b, it should be understood that the contraction stress generation portions 330 may be formed locally, or may be formed in a plurality of planes. It is therefore to be noted that the description given in conjunction with FIG. 2B includes not only an example in which the contraction stress generation portions 330 are formed throughout the photomask substrate, as in FIG. 2B, but also an example in which the contraction stress generation portions 330 are locally formed. For example, in the case where registration errors are to be locally corrected, registration errors may be locally corrected by irradiating a laser beam only onto the region of the inside of the substrate of the photomask 200b in which the registration errors are to be corrected, thereby locally forming the contraction stress generation portions 330. Furthermore, the contraction stress generation portions 330 may be formed in a plurality of layers to increase the registration correction effect. Although, as shown in FIG. 2B, the contraction stress generation portions 330 are formed in the same plane and in a single layer, it should be understood that various contraction stress generation portions 330 maybe formed in a plurality of planes. Although, in FIG. 2B, contraction stress generation portions 330 having the same size, the same distance and the same pitch are formed, it should be understood that contraction stress generation portions 330 having various sizes and distances may be formed.

When the contraction stress generation portions 330 are formed with, for example, the number, size, distance, pitch, thereof adjusted in various manners, the volume of the substrate of the photomask 300b may be contracted in a desired direction and size. Therefore, even in the case where registration errors of the optical pattern 310a having various sizes exist on the substrate of the photomask 300b, the registration errors may be corrected by forming the contraction stress generation portions 330 in various manners so that they are suitable for the respective sizes of the errors.

The contraction stress generation portions 330 maybe formed to have, for example, various sizes, densities and shapes depending on methods of irradiating a laser beam. For example, the sizes, densities and shapes of the contraction stress generation portions 330 formed in the substrate of the photomask 300b may be adjusted depending on various process conditions, such as the wavelength, focus position, focus size, radiation time and radiation cycle of the irradiated laser beam. That is, various types of contraction stress may be generated. Various registration errors may be corrected by forming various contraction stress generation portions 330 as described above. The method of forming various contraction stress generation portions 330 will be described later.

FIG. 2C is a cross section and registration map 405 of a photomask substrate 400 in which the various registration errors of an optical pattern 410 are corrected in an increasing and decreasing manner according to another exemplary embodiment of the present invention.

Referring to FIG. 2C, a photomask 400b, the registration errors of which have been corrected in an increasing and/or decreasing manner, is achieved by forming expansion stress generation portions 420 and contraction stress generation portions 430 in the substrate of a photomask 400a in which regions in which the registration errors of an optical pattern 410a are positive (+) and regions in which the registration errors of the optical pattern 410a are negative (−) coexist. In more detail, the contraction stress generation portions 430 are formed in the portions of the substrate of the photomask 400a corresponding to regions 'a' and 'c', in which registration errors are positive (+), and the expansion stress generation portions 420 are formed in the portions of the substrate of the photomask 400a corresponding to regions 'b' and 'd', in which registration errors are positive (−), thereby achieving the photomask 400b in which the registration errors have been corrected. In the right view of FIG. 2C, the cross section of the substrate of the photomask 400b may be understood to correspond to a cross section of a registration map 405b taken along line B-B' when considering the registration map 405b to be the photomask.

In this case, as described above, reference numeral 405 may be understood to refer to a plan view or registration map of the photomask 400 and reference numeral 415 may be understood to refer to the optical pattern 410 or a registration map of the optical pattern.

An actual photomask may exhibit a tendency for registration errors to occur in a uniform direction, for example, to occur entirely in a (+) or negative (−) direction. However, in a typical photomask, registration errors occur in respective regions in a random manner. Accordingly, the actual correction of registration may be performed by measuring the registration of a photomask having the complete optical pattern 410 and performing correction on the respective regions of the photomask. For example, all registration errors may be corrected by forming the expansion stress generation portions 420 in the regions 'b' and 'd' of the substrate of the photomask 400a, which correspond to regions in which registration errors are negative (−), and forming the contraction stress generation portions 430 in regions 'a' and 'c' of the substrate of the photomask 400a, which correspond to regions in which registration errors are positive (+).

Although, in FIG. 2C, an illustration is given with the case where the photomask is divided into the four regions having positive (+) or negative (−) registration errors taken as an example, this is only to promote an understanding of the technical spirit of the present invention. In actuality, as various registration errors are randomly distributed, various expansion stress generation portions and various contraction stress generation portions may be formed, so that various registration errors may need to be dealt with.

Several hundred millions to several billions of unit optical patterns 210, 310 or 410 may exist on an actual photomask 200, 300 or 400. The optical patterns 210, 310 or 410 on the photomask 200, 300 or 400 are divided into a plurality of blocks and are lithographed, depending on, for example, the shapes of the optical patterns 210, 310 and 410, computer data, and/or the characteristics of photomask lithography equipment. Therefore, the optical patterns 210, 310 or 410 on the photomasks 200, 300 or 400 have various registration errors based on the plurality of blocks on which lithography is performed. As it is may be complicated to completely illustrate the correction of the registration errors of the photomask 200, 300 or 400, the photomask 200, 300 or 400 the registration errors of which have been corrected are conceptually and simply illustrated.

Furthermore, in the case of correcting only the registration errors of the photomask 200, 300 or 400, stress generation portions 220, 230, 320, 330, 420 or 430 are preferably formed at positions corresponding to about ½ of a thickness of the substrate of the photomask 200, 300 or 400. When the stress generation portions 220, 230, 320, 330, 420 or 430 are formed in the central horizontal plane of the substrate of the photomask 200, 300 or 400, stress occurring in a vertical direction of the substrate of the photomask 200, 300 or 400 is low and occurs symmetrically in the vertical direction. Accordingly, the substrate of the photomask 200, 300 or 400 is not bent or curved. In the horizontal direction of the substrate of the photomasks 200, 300 and 400, a desired amount of stress may be generated depending on the number, size and pitch of the stress generation portions 220, 230, 320, 330, 420 or 430, and various parameters. However, the stress generation portions 220, 230, 320, 330, 420 or 430 may not be formed in the central horizontal plane if necessary. For example, there is a case where the stress generation portions 220, 230, 320, 330, 420 or 430 are formed throughout the substrate of the photomask 200, 300 or 400, a case where only a negligible amount of stress is generated in the vertical direction of the substrate of the photomask 200, 300 or 400, or a case where stress should be generated in the vertical direction of the substrate of the photomask 200, 300 or 400. For example, in the case where the substrate of the photomask 200, 300 or 400 is bent or curved in one direction, the substrate of the photomask 200 is not flat locally, or the like, the stress generation portions 220, 230, 320, 330, 420 or 430 may be formed to correct the defective factors of the substrate of the photomask 200, 300 or 400.

For example, if the expansion stress generation portions 220, 320 or 420 are formed at positions below the central horizontal plane of the photomask substrate 500 or the contraction stress generation portions 230, 330 or 430 are formed at positions above the central horizontal plane of the substrate of the photomask 200, 300 or 400 in the case where the center of the substrate of the photomask 200, 300 and 400 is convex, the photomask 200, 300 or 400 may be corrected into a completely horizontally flat shape.

Conversely, if the expansion stress generation portions 220, 320 and 420 are formed at positions above the central horizontal plane of the photomask substrate 500 or the contraction stress generation portions 230, 330 and 430 are formed at positions below the central horizontal plane of the substrate of the photomask 200, 300 or 400 in the case where the center of the substrate of the photomasks 200, 300 and 400 is concave, the substrate of the photomask 200, 300 or 400 may be corrected into a completely horizontally flat shape.

FIGS. 3A to 3F are cross sections showing the substrates of photomasks 500 and 600 and the substrates of photomasks 500 and 600 the registration errors of which have been corrected according to an exemplary embodiment of the present invention.

Figure 3A:
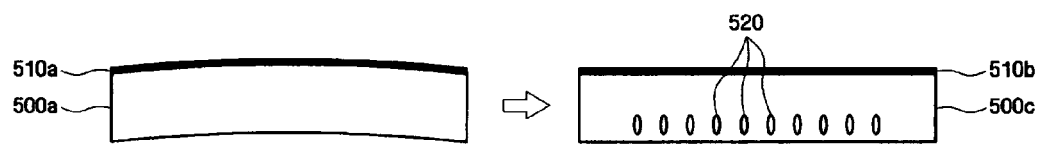
FIGS. 3A to 3F are cross sections schematically illustrating photomask substrates, and the substrates of photomasks in which registration errors have been corrected, according to an exemplary embodiment of the present invention.

Referring to FIG. 3A, expansion stress generation portions 520 are formed in the substrate of a photomask 500a having a convex center portion, thereby correcting the registration errors of an optical pattern 510a while correcting the substrate of the photomask 500a into a flat shape. When the expansion stress generation portions 520 are formed at positions below the central horizontal plane of the substrate of the photomask 500b, expansion stress may be generated in a horizontal direction, and therefore it is possible to correct the substrate of the photomask 500a having a convex center portion into a flat shape.

Figure 3B:
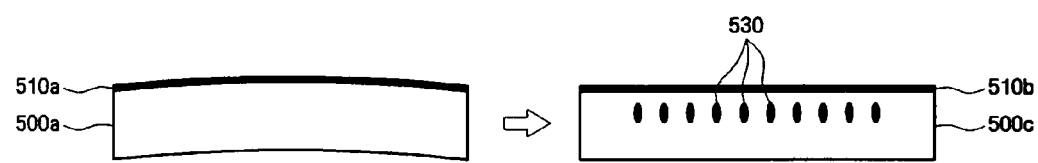

Referring to FIG. 3B, contraction stress generation portions 530 are formed in the substrate of a photomask 500a having a convex center, thereby connecting the registration errors of an optical pattern 510a while correcting the substrate of the photomask 500a into a flat shape. When the contraction stress generation portions 520 are formed at positions above the central horizontal plane of the substrate of the photomask 500b, contraction stress may be generated in a horizontal direction, and therefore it is possible to correct the substrate of the photomask 500a having a convex center into a flat shape.

Figure 3C:
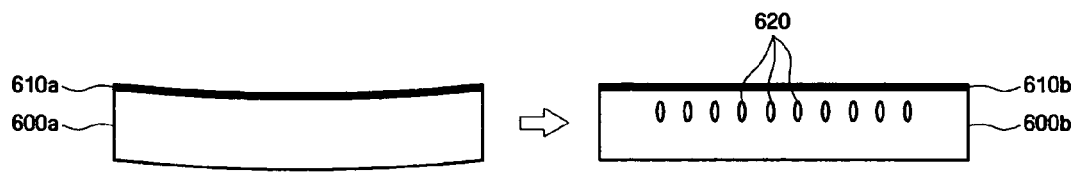

Referring to FIG. 3C, expansion stress generation portions 620 are formed in the substrate of a photomask 600a having a concave center, thereby correcting the registration errors of an optical pattern 610a while correcting the substrate of the photomask 600a into a flat shape. When the expansion stress generation portions 620 are formed at positions above the central horizontal plane of the substrate of the photomask 600b, expansion stress may be generated in a horizontal direction, and therefore it is possible to correct the substrate of the photomask 600a, having the concave center, into a flat shape.

Figure 3D:
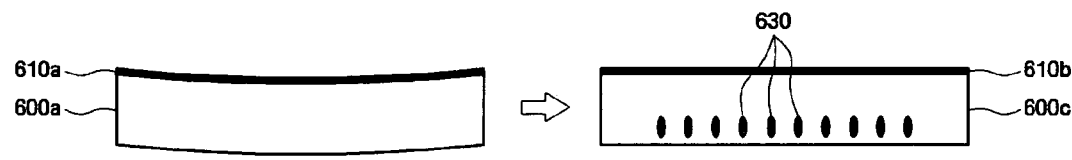

Referring to FIG. 3D, contraction stress generation portions 630 are formed in the substrate of a photomask 600a having a concave center portion, thereby correcting the registration errors of an optical pattern 610a while correcting the substrate of the photomask 600a into a flat shape. When the contraction stress generation portions 620 are formed at positions below the central horizontal plane of the substrate of the photomask 600b, contraction stress may be generated in a horizontal direction, therefore it is possible to correct the substrate of the photomask 600a having a concave center portion into a flat shape.

Figure 3E:
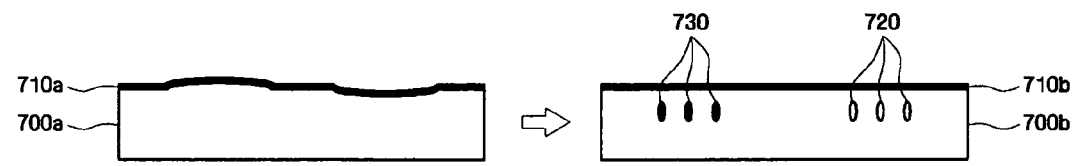

Referring to FIG. 3E, expansion stress generation portions 720 and contraction stress generation portions 730 are formed in the substrate of a photomask 700a having an uneven surface and a partially curved surface, thereby correcting the registration errors of an optical pattern 710a while correcting the substrate of a photomask 700b into a flat shape. In particular, the expansion stress generation portions 720 are formed in the substrate of the photomask 700a, which has a downwardly curved surface as well as positive (+) registration errors, and the contraction stress generation portions 730 are formed in the substrate of the photomask 700a, which has an upwardly curved surface as well as negative (−) registration errors, thereby correcting the registration errors of the optical pattern 710a while correcting the substrate of the photomask 700b into a flat shape. In the case of FIG. 3E, the irregularity of the surface of the substrate of the photomask 700a and the registration errors of the optical pattern 710a do not have a tradeoff relationship therebetween. Therefore, the surface of the substrate of the photomask 700a and the registration errors of the optical pattern 710a may be corrected by forming the expansion stress generation portions 720 or the contraction stress generation portions 730.

Figure 3F:
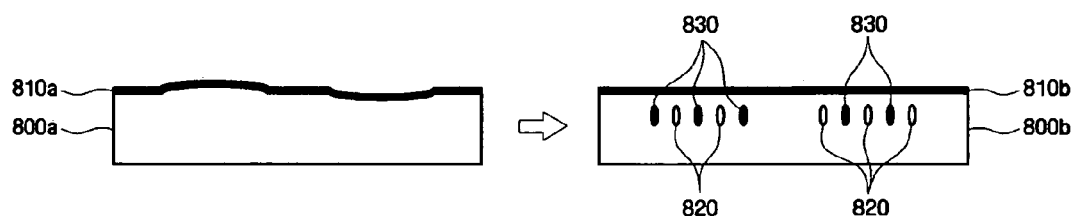

Referring to FIG. 3F, expansion stress generation portions 820 and contraction stress generation portions 830 are formed in a substrate of a photomask 800b having an uneven surface and a partially curved surface, thereby correcting the registration errors of an optical pattern 810a while correcting the substrate of the photomask 800b into a flat shape. For example, both the expansion stress generation portions 820 and the contraction stress generation portions 830 are formed in the substrate of the photomask 800a, with the result that it is possible to correct both portions, which have a downward curve as well as positive (+) registration errors, and portions, which have an upward curve as well as negative (−) registration errors.

In the case of FIG. 3F, the irregularity of the surface of the substrate of the photomask 800a and the registration errors of the optical pattern 810a have a trade-off relationship. Therefore, the surface of the substrate of the photomask 800a and the registration errors of the optical pattern 810a may be corrected at the same time by properly forming the expansion stress generation portions 820 and the contraction stress generation portions 830. For example, the stress generation portions 820 and 830 for correcting the irregularity of the photomask substrate may be formed at lower positions in the substrate of the photomask 800a and the stress generation portions 820 and 830 for correcting the registration errors of the optical pattern 810a may be formed at positions close to the surface of the substrate of the photomask 800a. Although, in FIG. 3F, the stress generation portions 820 and 830 are formed in the same horizontal plane, they may be formed in different horizontal planes. Alternatively, the stress generation portions 820 and 830 may be formed in a plurality of layers.

It is expected that the expansion stress or contraction stress generated by the stress generation portions 820 and 830 will be generated radially from the center of the stress generation portions 820 and 830. Accordingly, if the stress generation portions 820 and 830 are formed at positions close to the surface of the substrate of the photomask 800, the volume and shape of the substrate of the photomask 800 may change significantly due to the stress generation portions 820 and 830. Therefore, it is possible to form the stress generation portions 820 and 830 at the various positions in the photomask substrate 800 depending on the amount of stress to be generated.

If a plurality of the stress generation portions 820 and 830 is formed at positions close to the surface or bottom surface of the photomask 800, the substrate of the photomask 800 may change the volume of the substrate of the photomask 800 both in a vertical direction as well as in a horizontal direction. In this case, balance may be achieved by forming the stress generation portions 820 and 830 at corresponding opposite positions.

Figure 4:
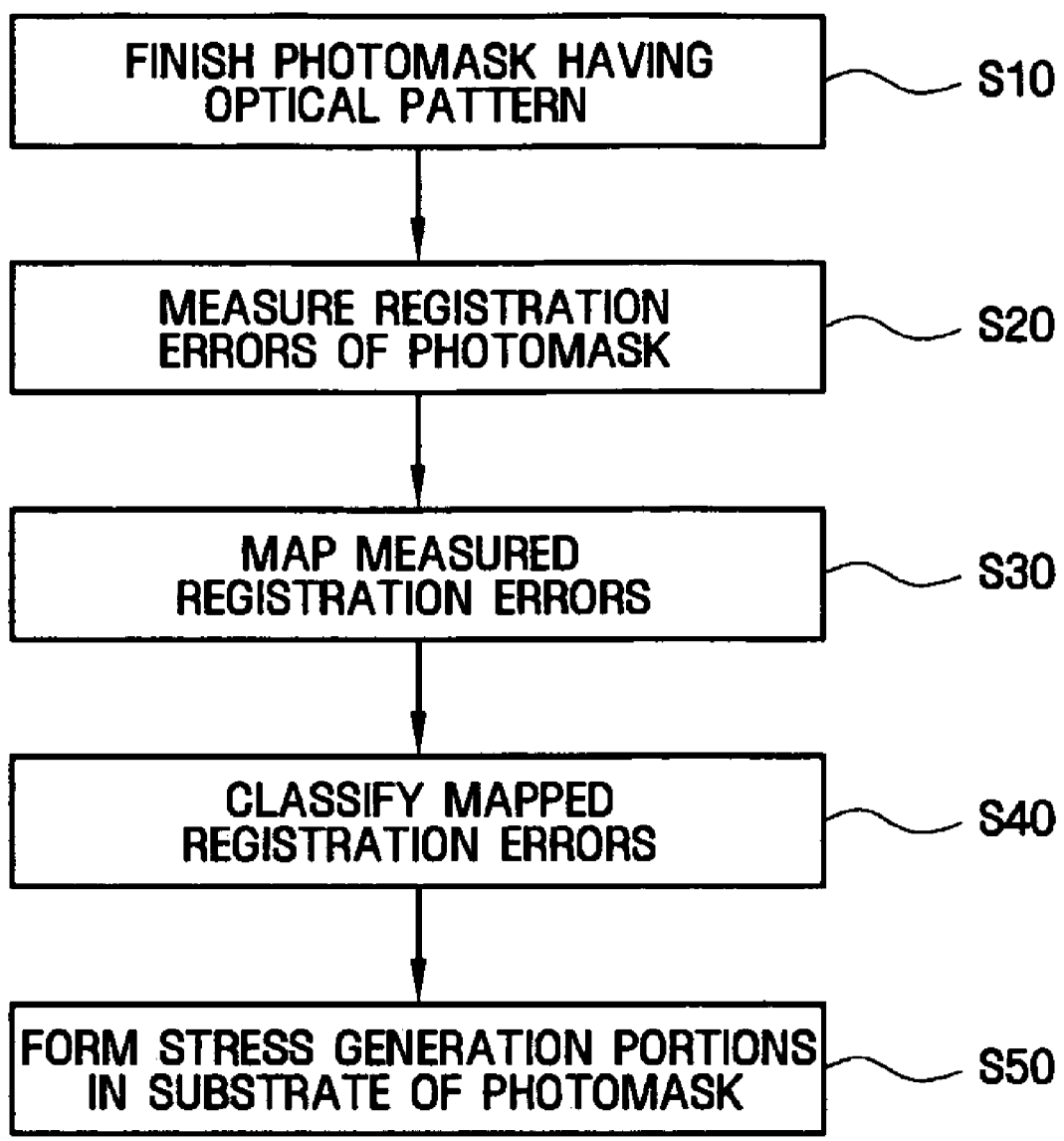
FIG. 4 is a flowchart illustrating a method of correcting the registration errors of a photomask according to an exemplary embodiment of the present invention.

FIG. 4 is a flowchart illustrating a method of correcting the registration errors of a photomask according to an exemplary embodiment of the present invention.

Referring to FIG. 4, the method of correcting registration errors of a photomask according to an exemplary embodiment of the present invention includes the steps of fabricating a photomask having an optical pattern formed on one surface thereof (S10), measuring the registration of the fabricated photomask (S20), mapping the measured registration (S30), classifying the mapped registration into negative (−) values, positive (+) values and the size ranges of values (S40), and forming stress generation portions within the substrate of the photomask to correspond to the classified registration error regions (S50).

A photomask having an optical pattern on one surface thereof is first formed by a known method at step S10. The optical pattern may be a reflection type pattern that reflects light when the photomask is a reflection type photomask, a pattern that blocks light when the photomask is a transmission type photomask, and a phase shift pattern when the photomask is a phase shift mask. The registration of the fabricated photomask is measured at step S20. The registration of the photomask maybe measured by comparing the optical pattern of an ideal photomask (for example, the computer data of an optical pattern on a photomask) with the optical pattern of the actually fabricated photomask. The registration of the photomask may be measured for respective optical pattern blocks or for respective optical patterns. For example, a method of previously setting registration tolerances for respective photomasks or optical patterns and displaying or storing only registration portions exceeding those tolerances in the negative (−) or positive (+) direction may be used.

The data of the measured registration (for example, the data of registration errors) is mapped at step S30. The mapping of the registration error data may be performed, for example, by matching positions in the substrate of a photomask at which stress generation portions will be formed, the number of stress generation portions to be formed, and other information to each other based on the registration errors of an actual photomask. The other information may include, for example, process standards that have been set through experiments. For example, the other information may include detailed information about the types, sizes, numbers, areas, and the like of stress generation portions that will be formed depending on the signs (negative or positive) and sizes of registration errors.

The regions of the substrate of the photomask in which stress generation portions will be formed, are classified based on the mapped data at step S40. The stress generation portions to be formed in the photomask substrate include expansion stress generation portions and contraction stress generation portions. Therefore, the regions may be divided into regions in which expansion stress generation portions will be formed and regions in which contraction stress generation portions will be formed. Thereafter, whether to form the respective stress generation portions at the same time or separately may be determined. Furthermore, how much expansion stress or contraction stress are to be generated may be determined according to the sizes of registration errors. Several process parameters for forming the respective stress generation portions may be set according to results of the determination. Alternatively, if stress to be generated and process parameters to be used are set, mapping data for forming the stress generation portions may be modified or converted such that the mapping data corresponds to the stress to be generated, thereby finishing final work data.

A process for forming each of the stress generation portions is performed based on the finished final work data at step S50. When each stress generation portion is formed, various stress generation portions may be formed depending on various process conditions. For example, various types of expansion stress may be generated according to various radiation conditions of a laser beam when expansion stress generation portions are formed, and various types of contraction stress may be generated according to various radiation conditions of a laser beam when contraction stress generation portions are formed. Accordingly, the laser beam may be irradiated based on various processes that are simplified to several standardized processes.

In the case where the expansion stress generation portions and the contraction stress generation portions are formed at the same time, various stress generation portions may be generated by irradiating a laser beam while changing the process conditions of the laser beam irradiated to form respective stress generation portions in real time.

In the case where the expansion stress generation portions and the contraction stress generation portions are separately formed, either the expansion stress generation portions or the contraction stress generation portions may be first formed, and the other may be formed thereafter. In this case, the expansion stress generation portions and the contraction stress generation portions may be formed using a method similar to that used to form the two types of stress generation portions at the same time. In another method, the stress generation portions may be formed by optimizing and fixing several process conditions of the irradiated laser beam and then moving the stage on which the photomask substrate is mounted. For example, the expansion stress generation portions or the contraction stress generation portions may be formed by fixing the process conditions of the laser beam so that expansion stress generation portions or contraction stress generation portions having a uniform size are formed, and then moving the stage. In this case, if stress to be generated is greater than stress generated by each of the stress generation portions formed according to the fixedly set laser radiation conditions, the respective stress generation portions may be formed such that they overlap each other at narrow intervals or partially. If the stress to be generated is smaller than that generated by each of the stress generation portions formed according to the fixed laser radiation conditions, the respective stress generation portions may be formed at wide intervals. Reference values may be set based on optimal laser process conditions obtained through various experiments and in consideration of typical laser process conditions and the movement conditions of a stage. The reference values are not set to specific values, but may be set in various manners, such as for example, depending on the types of photomasks the registration errors of which will be corrected, the various shapes of optical patterns formed on the substrates of photomasks, the laser beam to be used, the various conditions of a laser beam, and so on.

Figure 5:
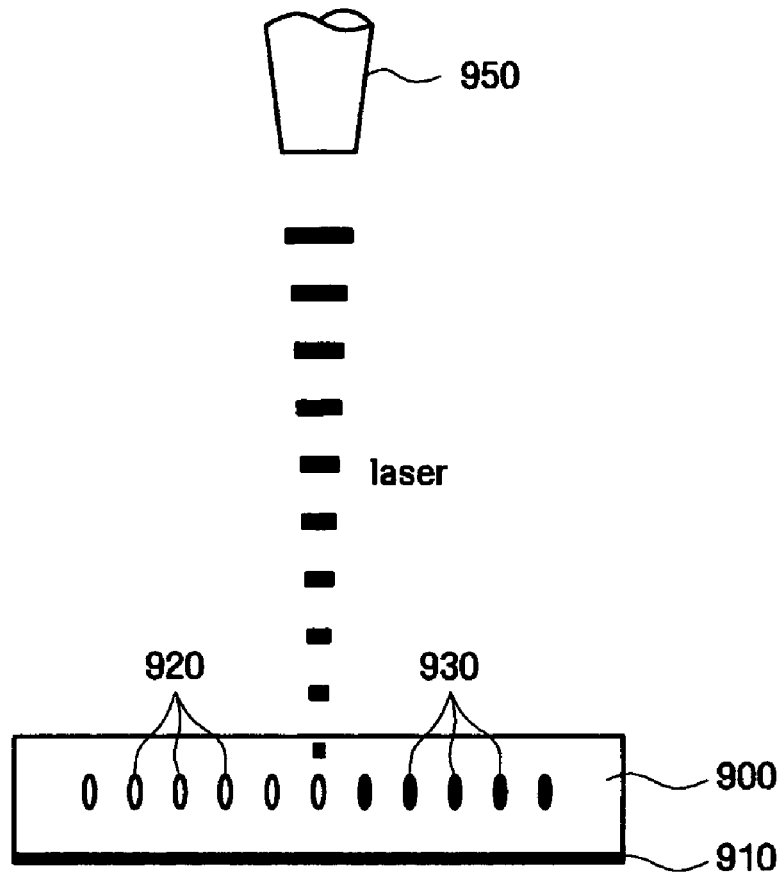
FIG. 5 is a view illustrating a method of forming stress generation portions in the substrate of a photomask according to an exemplary embodiment of the present invention.

FIG. 5 is a view illustrating a method of forming stress generation portions 920 and 930 in the substrate of a photomask 900 according to an exemplary embodiment of the present invention.

Referring to FIG. 5, the method of forming the stress generation portions 920 and 930 in the substrate of the photomask 900 according to the present exemplary embodiment of the present invention is performed by forming various stress generation portions 920 and 930 in the substrate of the photomask 900 by irradiating a laser beam using a laser gun 950.

If the laser beam is focused and irradiated on the substrate of the photomask 900, the bonding state of the substrate of the photomask 900 may change locally at the position of the focus of the laser beam. For example, as the substrate of the photomask 900 is melted for a short period of time and is then solidified again, the bonding density of the photomask substrate may change. The irradiated laser beam may be, for example, a femto-second laser beam in pulse form.

For example, the stress generation portions 920 and 930 having various shapes may be formed by controlling various parameters, such as the energy, duration, frequency and radiation time of the irradiated laser beam, and various parameters, such as the position of a focus and the size of a focus within the substrate of the photomask 900. In this case, the optical pattern 910 may be located at a position opposite the position at which the laser beam is irradiated.

Figure 6:
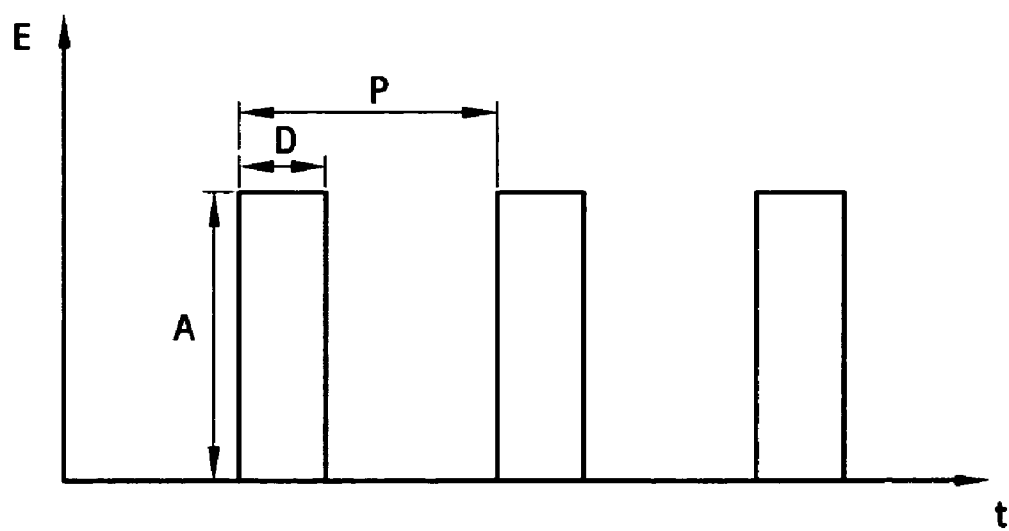
FIG. 6 is a view illustrating a laser beam irradiated to form stress generation portions in a photomask substrate according to an exemplary embodiment of the present invention.

FIG. 6 is a view illustrating a laser beam that is irradiated to form stress generation portions in the substrate of the photomask according to an exemplary embodiment of the present invention.

Referring to FIG. 6, the laser beam irradiated to form the stress generation portions in the substrate of the photomask according to the present exemplary embodiment of the present invention is irradiated in pulse form, with frequency, duration, energy and so on being controlled. In FIG. 6, the X axis represents time t and the Y axis represents the energy E of the laser beam.

The laser beam used in the exemplary embodiments of the present invention may be irradiated at energy A, for pulse duration D, and at frequency F. That is, various stress generation portions may be formed by controlling the pulse duration and frequency of the irradiated laser beam. The pitch P between the pulses may be determined according to the frequency F. For example, the pulse duration may be set to a value smaller than half of the pitch.

The laser beam used in the embodiments of the present invention may be a laser beam using titanium (Ti):Sapphire as a light source. In particular, the laser beam may be a femto-second laser beam. As the femto-second laser beam is well known in the art, a detailed description thereof is omitted here.

The laser beam used in the exemplary embodiments of the present invention may be irradiated at an energy A of about several microjoules ($\mu$J) per pulse, for a pulse duration D of several ps, and at a frequency F of about 100 kilohertz (KHz). As this is an example for illustrating the implementation of the technical spirit of the present invention, the exemplary embodiments of the present invention are not limited thereto. For example, although a laser beam having a pulse energy of several $\mu$J has been used in the present exemplary embodiment, a laser beam having a high pulse energy of about several mJ or a laser beam having a still lower pulse energy may be used. Furthermore, the pulse duration may be at a femto-second level.

Quartz, which is the material of the photomask substrate, has a thermal diffusion period of about several ms per 1 micrometer ($\mu$m). Therefore, if a high energy laser beam is irradiated for a period shorter than the thermal diffusion period, the bonding state of the portion onto which the laser beam has been irradiated may change without affecting surrounding regions. In other words, only the portion onto which the laser beam has been irradiated may be adapted to have expansion or contraction stress.

In the exemplary embodiments of the present invention, the expansion stress generation portions may be formed using a method of irradiating a laser beam having relatively high energy to an extent that does not affect surrounding regions. In more detail, the pulse duration may be about 5 to about 7 ps, the laser energy may be about 3 to about 4 $\mu$J, the frequency may be about 100 KHz, the diameter of the spot of a laser beam maybe about 1 $\mu$m, and a distance between the expansion stress generation portions may be about 3 $\mu$m. Furthermore, the stress generation portions may have a length of about several $\mu$m or about several tens of $\mu$m in a vertical direction and a length of about 1 $\mu$m in a horizontal direction. However, these exemplary embodiments may be implemented in various manners. Therefore, the present exemplary embodiment is illustrative and the technical spirit of the present invention is not limited thereto.

Furthermore, in the exemplary embodiments of the present invention, the contraction stress generation portions may be formed using a method of irradiating a laser beam having a relatively low energy that may change the bonding state of the substrate of the photomask to an extent that does not affect surrounding regions. In more detail, the pulse duration may be about 1 ps, the laser energy may be about 1.5 $\mu$J, the frequency of the laser beam and the diameter of the spot of the laser beam maybe the same as those at the time when the expansion stress generation portions are formed, and the distance between the stress generation portions maybe about 1.8 $\mu$m. The contraction stress generation portions may have a size similar to or smaller than that of the expansion stress generation portions.

The expansion stress generation portions corresponding to respective conditions may be formed using various methods. For example, when the laser radiation time is controlled, there is a tendency for expansion stress to be generated as the radiation period is increased, and for contraction stress to be generated as the radiation period is decreased. When the laser radiation energy is controlled, there is a tendency for expansion stress to be generated as the energy becomes high, and for contraction stress to be generated as the energy becomes low. Furthermore, when the laser duration is controlled, there is a tendency for expansion stress to be generated and for contraction stress to be generated as the duration increases.

Process parameters will be less sensitive or more sensitive according to the circumstances in which a person desires to implement the technical spirit of exemplary embodiments of the present invention. Furthermore, various stress generation portions may be formed depending on, for example, the types of equipment and a laser beam, the density of a laser beam, the profile of a laser beam, and so on. Therefore, it should be understood that the values proposed in the present specification are only examples and do not limit the scope of the present invention.

As described above, in accordance with the photomask, the registration errors of which have been corrected and a method of correcting the registration errors of the photomask according to the exemplary embodiments of the present invention, finished photomasks may be modified and used without the need to discard them due to registration errors. Therefore, there are benefits in that the manufacturing cost of photomasks and semiconductor devices may be reduced and the production period thereof may be shortened.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A photomask comprising:
   a photomask substrate;
   an optical pattern formed on one surface of the photomask substrate; and
   a plurality of stress generation portions formed in the photomask substrate and having a light-permeability.

2. The photomask of claim 1, wherein the plurality of stress generation portions are formed to correspond to registration errors of the optical pattern.

3. The photomask of claim 2, wherein the registration errors of the optical pattern are corrected as the optical pattern physically moves due to action of the stress generation portions.

4. The photomask of claim 1, wherein the stress generation portions comprises a first stress generation portions and a second stress generation portions, the first stress generation portions have a density higher than an average density of the photomask substrate such that the stress generation portions are portions that generate stress that contracts the photomask substrate, and the second stress generation portions have a density lower than an average density of the photomask substrate such that the stress generation portions are portions that generate stress that expands the photomask substrate.

5. The photomask of claim 1, wherein the stress generation portions each have an elliptical sphere in which a size in a vertical direction is larger than that in a horizontal direction.

6. The photomask of claim 1, wherein the stress generation portions are formed at positions within a range of about ¼ to about ¾ of a thickness of the photomask substrate.

7. The photomask of claim 6, wherein the stress generation portions are formed at positions corresponding to about ½ of the thickness of the photomask substrate.

8. The photomask of claim 1, wherein the stress generation portions are formed in a single horizontal plane.

9. The photomask of claim 1, wherein the stress generation portions are formed in a plurality of layers.

10. The photomask of claim 1, wherein the stress generation portions are formed at positions close to one of top and bottom surfaces of the photomask substrate and generate contraction stress.

11. The photomask of claim 1, wherein the stress generation portions are formed at positions close to one of top and bottom surfaces of the photomask substrate and generate expansion stress.

12. The photomask of claim 1, wherein the optical pattern selectively reflects light.

13. The photomask of claim 2, wherein the optical pattern comprises a reflection layer that reflects light and a light-absorbing layer that does not reflect light.

14. The photomask of claim 13, wherein the reflection layer is formed by alternately stacking a plurality of material layers, comprising silicon and molybdenum layers.

15. The photomask of claim 13, wherein the light-absorbing layer is formed of a metal and a metal oxide film.

16. The photomask of claim 1, wherein the stress generation portions are formed by irradiating a laser beam.

17. The photomask of claim 16, wherein the laser beam is irradiated in pulse form.

18. A method of correcting registration errors of a photomask, the method comprising:
    forming an optical pattern on a photomask substrate;
    measuring the registration errors of the optical pattern; and
    forming a plurality of stress generation portions having a light-permeability in the photomask substrate so that the stress generation portions correspond to the measured registration errors.

19. The method of claim 18, wherein the registration errors of the optical pattern are corrected as the optical pattern physically moves due to action of the stress generation portions.

20. The method of claim 18, wherein the stress generation portions comprises a first stress generation portions and a second stress generation portions, the first stress generation portions have a density higher than an average density of the photomask substrate such that the stress generation portions are portions that generate stress that contracts the photomask substrate, and the second stress generation portions have a density lower than an average density of the photomask substrate such that the stress generation portions are portions that generate stress that expands the photomask substrate.

21. The method of claim 18, wherein the stress generation portions each have an elliptical sphere in which a size in a vertical direction is larger than that in a horizontal direction.

22. The method of claim 18, wherein the stress generation portions are formed at positions within a range of about ¼ to about ¾ of a thickness of the photomask substrate.

23. The method of claim 22, wherein the stress generation portions are formed at positions corresponding to about ½ of the thickness of the photomask substrate.

24. The method of claim 18, wherein the stress generation portions are formed in a single horizontal plane.

25. The method of claim 18, wherein the stress generation portions are formed in a plurality of layers.

26. The method of claim 18, wherein the stress generation portions are formed at positions close to one of top and bottom surfaces of the photomask substrate and generate contraction stress.

27. The method of claim 18, wherein the stress generation portions are formed at positions close to one of top and bottom surfaces of the photomask substrate and generate expansion stress.

28. The method of claim 18, wherein the optical pattern selectively reflects light.

29. The method of claim 28, wherein the optical pattern includes a reflection layer that reflects light and a light-absorbing layer that does not reflect light.

30. The method of claim 29, wherein the reflection layer is formed by alternately stacking a plurality of material layers, comprising silicon and molybdenum layers.

31. The method of claim 29, wherein the light-absorbing layer is formed of a metal and a metal oxide film.

32. The method of claim 18, wherein the stress generation portions are formed by irradiating a laser beam.

33. The method of claim 32, wherein the laser beam is irradiated in a pulse form.

34. A method of correcting registration errors of a photomask, the method comprising:
    finishing a photomask having an optical pattern on one surface thereof;
    measuring registration errors of the finished photomask;
    mapping the measured registration errors;
    classifying the mapped registration errors according to size; and
    forming a plurality of stress generation portions having a light-permeability in portions of a photomask substrate corresponding to ranges of the classified registration errors, thereby correcting the registration errors.

* * * * *